United States Patent
Yoon et al.

(10) Patent No.: US 9,488,336 B2
(45) Date of Patent: Nov. 8, 2016

(54) WAVELENGTH CONVERSION STRUCTURE, APPARATUS COMPRISING WAVELENGTH CONVERSION STRUCTURE, AND RELATED METHODS OF MANUFACTURE

(71) Applicants: Chang Bun Yoon, Anyang-Si (KR); Sang Hyun Kim, Suwon-Si (KR); Min Jung Park, Hanam-Si (KR); Chul Soo Yoon, Suwon-Si (KR)

(72) Inventors: Chang Bun Yoon, Anyang-Si (KR); Sang Hyun Kim, Suwon-Si (KR); Min Jung Park, Hanam-Si (KR); Chul Soo Yoon, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/046,518

(22) Filed: Feb. 18, 2016

(65) Prior Publication Data

US 2016/0161090 A1 Jun. 9, 2016

Related U.S. Application Data

(63) Continuation of application No. 14/155,405, filed on Jan. 15, 2014, now Pat. No. 9,297,502.

(30) Foreign Application Priority Data

Jul. 4, 2013 (KR) ........................ 10-2013-0078447

(51) Int. Cl.
| | |
|---|---|
| *H05B 33/14* | (2006.01) |
| *H01L 51/54* | (2006.01) |
| *F21V 9/16* | (2006.01) |
| *C09K 11/02* | (2006.01) |

(Continued)

(52) U.S. Cl.
CPC ................. *F21V 9/16* (2013.01); *C03B 19/06* (2013.01); *C03B 19/063* (2013.01); *C03B 19/09* (2013.01); *C03B 19/10* (2013.01); *C03C 3/066* (2013.01); *C09K 11/025* (2013.01); *C09K 11/54* (2013.01); *C09K 11/65* (2013.01); *C09K 11/703* (2013.01); *C09K 11/7734* (2013.01); *F21K 9/232* (2016.08); *F21K 9/64* (2016.08); *H01L 33/501* (2013.01); *C03B 2201/06* (2013.01); *F21W 2101/10* (2013.01); *H01L 2933/0041* (2013.01)

(58) Field of Classification Search
CPC ..... H01L 51/54; H01L 33/501; H05B 33/14; F21V 9/16; F21K 9/232; F21K 9/64; C03C 3/066; C09K 11/54; C09K 11/703; C09K 11/65; C09K 11/025; C09K 11/7734; C03B 19/063; C03B 19/06; C03B 19/10; C03B 19/09; F21W 2101/10
USPC ........................................ 313/503; 252/301.4
See application file for complete search history.

(56) References Cited

U.S. PATENT DOCUMENTS

| | | |
|---|---|---|
| 4,242,221 A | 12/1980 | Cusano et al. |
| 5,998,925 A | 12/1999 | Shimizu et al. |

(Continued)

FOREIGN PATENT DOCUMENTS

| | | |
|---|---|---|
| JP | 2008-169348 | 7/2008 |
| JP | 2008-255362 | 10/2008 |

(Continued)

*Primary Examiner* — Donald Raleigh
(74) *Attorney, Agent, or Firm* — Volentine & Whitt, PLLC

(57) ABSTRACT

A wavelength conversion structure comprises a sintered body comprising a mixture of a wavelength conversion material and a glass composition, wherein the wavelength conversion material comprises a phosphor and the glass composition comprises $ZnO$—$BaO$—$SiO_2$—$B_2O_3$.

11 Claims, 13 Drawing Sheets

(51) Int. Cl.
*C03B 19/06* (2006.01)
*C03B 19/10* (2006.01)
*C03B 19/09* (2006.01)
*C09K 11/77* (2006.01)
*C03C 3/066* (2006.01)
*C09K 11/54* (2006.01)
*C09K 11/65* (2006.01)
*C09K 11/70* (2006.01)
*H01L 33/50* (2010.01)
*F21W 101/10* (2006.01)

(56) References Cited

U.S. PATENT DOCUMENTS

| | | | |
|---|---|---|---|
| 6,624,225 B1 | 9/2003 | Ellison et al. | |
| 7,329,988 B2 | 2/2008 | Shimizu et al. | |
| 7,361,938 B2 | 4/2008 | Mueller et al. | |
| 7,682,850 B2 | 3/2010 | Harbers et al. | |
| 2007/0054794 A1 | 3/2007 | Nagaoka | |
| 2008/0180018 A1* | 7/2008 | Minamoto | C03C 14/006 313/483 |
| 2008/0191236 A1 | 8/2008 | De Graaf et al. | |
| 2009/0002810 A1 | 1/2009 | Jeon et al. | |
| 2010/0142189 A1 | 6/2010 | Hong et al. | |
| 2010/0155666 A1 | 6/2010 | Fujita et al. | |
| 2010/0263723 A1 | 10/2010 | Allen et al. | |
| 2010/0292066 A1* | 11/2010 | Zou | C03B 40/02 501/32 |
| 2011/0309398 A1 | 12/2011 | Ito et al. | |
| 2012/0138855 A1 | 6/2012 | Fujita et al. | |
| 2012/0140496 A1 | 6/2012 | Kishimoto et al. | |
| 2012/0194065 A1 | 8/2012 | Aoki et al. | |
| 2013/0329442 A1 | 12/2013 | Kishimoto et al. | |

FOREIGN PATENT DOCUMENTS

| | | |
|---|---|---|
| JP | 2010-132923 | 6/2010 |
| JP | 2010-278474 | 12/2010 |
| JP | 2012-124250 | 6/2012 |
| KR | 10-2007-0075952 | 7/2007 |
| KR | 10-2009-0026754 | 3/2009 |
| KR | 2012-136686 | 7/2012 |
| KR | 10-1142758 | 8/2012 |
| KR | 2012-158494 | 8/2012 |
| KR | 1020130026771 A | 3/2013 |
| TW | 201217293 A | 5/2012 |

* cited by examiner

B - B'

WAVELENGTH CONVERSION STRUCTURE, APPARATUS COMPRISING WAVELENGTH CONVERSION STRUCTURE, AND RELATED METHODS OF MANUFACTURE

CROSS-REFERENCE TO RELATED APPLICATIONS

This application is a Continuation of U.S. application Ser. No. 14/155,405, filed Jan. 15, 2014, which claims priority under 35 U.S.C. §119 to Korean Patent Application No. 2013-0078447 filed on Jul. 4, 2013, the subject matter of which is hereby incorporated by reference.

BACKGROUND OF THE INVENTION

The inventive concept relates generally to lighting technologies. More particularly, certain embodiments of the inventive concept relate to wavelength conversion structures for lighting devices, apparatuses comprising wavelength conversion structures, and methods for manufacturing wavelength conversion structures.

Wavelength conversion structures are often used in combination with light emitting devices (LEDs) to convert emitted light of a first set of wavelengths (e.g., red light) into a light of a different set of wavelengths (e.g., white light). Wavelength conversion structures are generally used because of cost and/or performance considerations. For instance, a red LED may be less expensive, more luminescent, and more power efficient than a white LED, and therefore it may be advantageous to use a red LED and wavelength conversion structure rather than generating white light directly.

A typical wavelength conversion structure comprises a wavelength conversion material mixed with a molding resin. The wavelength conversion material becomes excited by absorption of primary light and, and then gives off secondary light as a consequence of the excitation. This process of absorption and excitation is commonly referred to as luminescence or fluorescence. In most conventional devices, the wavelength conversion material takes the form of a phosphor or mixture of phosphors.

During typical use, the wavelength conversion structure is placed around a LED or directly on a chip surface. In this configuration, the wavelength conversion material may be degraded due to heat and light from the LED. This degradation, in turn, can result in discoloration of the secondary light and diminished reliability of the wavelength conversion structure.

SUMMARY OF THE INVENTION

In one embodiment of the inventive concept, a wavelength conversion structure comprises a sintered body comprising a mixture of a wavelength conversion material and a glass composition, wherein the wavelength conversion material comprises a red phosphor and the glass composition comprises $ZnO$—$BaO$—$SiO_2$—$B_2O_3$.

In another embodiment of the inventive concept, a method of manufacturing a wavelength conversion structure comprises mixing a wavelength conversion material with a glass composition to form a compound green body, wherein the wavelength conversion material comprises a red phosphor, and sintering the compound green body at a temperature less than or equal to approximately 600° C.

In yet another embodiment of the inventive concept, a method of manufacturing a wavelength conversion structure comprises mixing a wavelength conversion material with a glass composition to form a compound green body, wherein the wavelength conversion material comprises a red phosphor and the glass composition comprises $ZnO$—$BaO$—$SiO_2$—$B_2O_3$, and sintering the compound green body.

In yet another embodiment of the inventive concept, an apparatus comprises first and second electrode structures, a semiconductor LED connected to the first and second electrode structures, and a wavelength conversion structure positioned in a light emission path of the semiconductor LED and comprising a sintered body comprising a mixture of a wavelength conversion material and a glass composition, wherein the wavelength conversion material comprises a red phosphor and the glass composition comprises $ZnO$—$BaO$—$SiO_2$—$B_2O_3$.

In yet another embodiment of the inventive concept, a wavelength conversion structure comprises a sintered body comprising a mixture of a wavelength conversion material and a glass composition, wherein the wavelength conversion material comprises a phosphor and the glass composition comprises $ZnO$—$BaO$—$SiO_2$—$B_2O_3$ and at least one of $Na_2O$, $CaO$, $K_2O$, $Li_2O$, and $P_2O_5$.

These and other embodiments of the inventive concept may allow wavelength conversion structures to be formed at relatively low temperatures, which may prevent degradation of wavelength conversion materials, such as phosphors, and may also prevent a reduction of transparency due to crystallization.

BRIEF DESCRIPTION OF THE DRAWINGS

The drawings illustrate selected embodiments of the inventive concept. In the drawings, like reference numbers indicate like features.

DETAILED DESCRIPTION

Selected embodiments of the inventive concept are described below with reference to the accompanying drawings. These embodiments are presented as teaching examples and should not be construed to limit the scope of the inventive concept.

The described embodiments relate to wavelength conversion structures for solid-state lighting devices, apparatuses comprising wavelength conversion structures, and methods for manufacturing wavelength conversion structures. In certain embodiments, a wavelength conversion structure comprises a sintered body comprising a mixture of a wavelength conversion material and a glass composition. The wavelength conversion material typically comprises a phosphor or mixture of phosphors, and the glass composition typically comprises $ZnO$—$BaO$—$SiO_2$—$B_2O_3$. The glass composition may further comprise at least one of $Na_2O$, $CaO$, $K_2O$, $Li_2O$, and $P_2O_5$.

The wavelength conversion structure typically employs $ZnO$—$BaO$—$SiO_2$—$B_2O_3$ as a base composition, and it employs additional materials to adjust certain properties of the base composition such as transparency and/or firing temperature. The transparency of wavelength conversion structure can be adjusted, for instance, by increasing or decreasing a concentration of $SiO_2$ and/or $B_2O_3$ in the base composition. The firing temperature of the wavelength conversion structure can be adjusted (i.e., lowered) by adding to the glass composition either $P_2O_5$ or an alkali or alkaline earth material, such as $Na_2O$, $CaO$, $K_2O$, or $Li_2O$.

In the description that follows, the notation X-Y (e.g., as in $ZnO$—$BaO$—$SiO_2$—$B_2O_3$) indicates a mixture of compounds X and Y. The dash between X and Y is not indicative of chemical bonding. The notation N % wt X (e.g., as in 15% wt $SiO_2$) indicates that the compound X accounts for approximately N percent of the total weight of a designated structure, substance, or composition.

Figure 1:
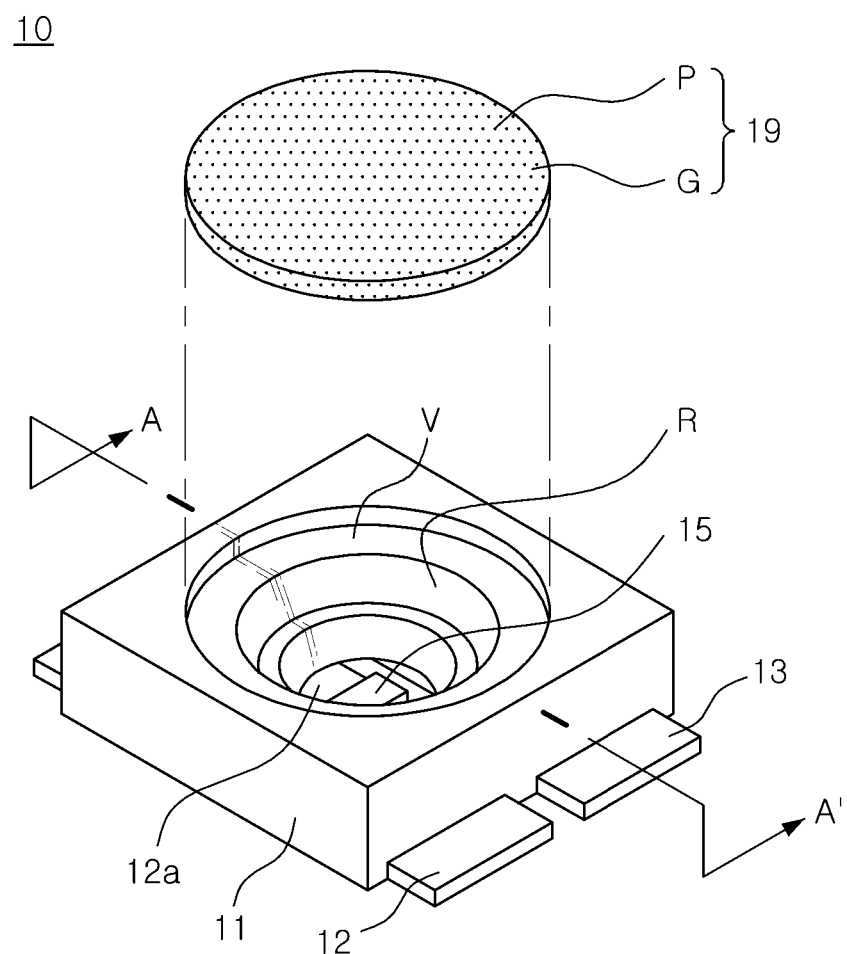
FIG. 1 is a perspective view of an apparatus comprising a semiconductor LED and a wavelength conversion structure, according to an embodiment of the inventive concept.
Figure 2:
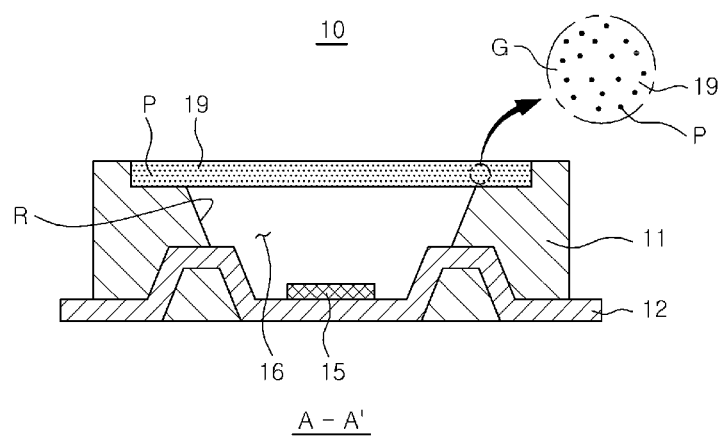
FIG. 2 is a cross-sectional view of the apparatus of FIG. 1, according to an embodiment of the inventive concept.

FIGS. 1 and 2 are a perspective view and a cross-sectional view, respectively, of an apparatus comprising a semiconductor LED and a wavelength conversion structure, according to an embodiment of the inventive concept.

Referring to FIGS. 1 and 2, a semiconductor light emitting apparatus 10 comprises a package body 11, a semiconductor LED 15, and a wavelength conversion structure 19.

Package body 11 comprises first and second lead frames 12 and 13 as electrode structures. Package body 11 has a stoppage protrusion V for supporting wavelength conversion structure 19, and a recess portion R that opens upwardly and exposes part of first and second lead frames 12 and 13. Semiconductor LED 15 is provided in package body 11, and is electrically connected to first and second lead frames 12 and 13.

Semiconductor LED 15 is disposed on a bottom portion 12a formed by bending first lead frame 12, and it is connected to second lead frame 13 by a wire. A transparent resin portion 16 may be disposed in recess portion R to encompass semiconductor LED 15, as necessary. Package body 11 and lead frames 12 and 13 may be modified in various alternative embodiments, and a scheme for connecting semiconductor LED 15 to electrode structures may be changed to a different form, such as wire bonding.

Wavelength conversion structure 19 is positioned on a path along which light is emitted from semiconductor LED 15, referred to as a "light emission path" of semiconductor LED 15. In the embodiment of FIG. 1, wavelength conversion structure 19 is disposed above recess portion R of package body 11, although it could be located elsewhere as indicated by other embodiments.

Wavelength conversion structure 19 comprises a sintered body comprising a mixture of a wavelength conversion material P and a glass composition G. Wavelength conversion material P may be, for instance, an inorganic phosphor or a quantum dot. Moreover, wavelength material P may comprise a combination or mixture of multiple wavelength conversion materials configured to emit light of different wavelengths. For example, wavelength conversion material P may comprise one or more of a green phosphor, a yellow phosphor, an orange phosphor, and a red phosphor.

Glass composition G is designed to be fired at low temperatures and to achieve a high degree of light transmittance in a sintered compound state. This is accomplished by forming glass composition G with a base compound comprising $ZnO$—$BaO$—$SiO_2$—$B_2O_3$, and at least one additive selected from a group consisting of $P_2O_5$ and an alkali or alkaline earth material such as $Na_2O$, $CaO$, $K_2O$ and $Li_2O$.

Glass composition G is also designed to be relatively transparent. This is accomplished by adjusting a relative concentration of $SiO_2$ and/or $B_2O_3$ in the base composition, which contributes to phase stabilization. The term "phase stabilization", in this context, generally refers to stabilizing glass composition G in a relatively amorphous phase, which is relatively transparent. In the absence of proper phase stabilization, glass composition G may assume a crystalline phase during a sintering process, making it undesirably opaque. However, with appropriate transparency, wavelength conversion structure 19 may achieve a total transmittance in the visible band of the electromagnetic spectrum of 90-95% or more.

Glass composition G typically comprises 30-60 wt % ZnO—BaO, 5-25 wt % $SiO_2$, 10-30 wt % $B_2O_3$, 5-20 wt % $P_2O_5$ on the basis of the gross weight of the glass composition. It may further comprise 20 wt % or less of at least one of $Na_2O$, CaO, $K_2O$, and $Li_2O$. Nevertheless, glass composition G is not limited to the above proportions.

To form glass composition G, raw materials may be provided in a form such as a carbonate or an oxide prior to firing or melting. For example, raw materials for BaO, $Na_2O$, $K_2O$, and $Li_2O$ may be provided in the form of $BaCO_3$, $Na_2CO_3$, $K_2CO_3$, $Li_2CO_3$, respectively. Additionally, a single raw material may be used to form multiple components of a mixture. For instance, $Zn_3PO_4$ may be used to form both ZnO and $P_2O_5$.

Glass composition G is typically sintered at a temperature less than or equal to about 600° C., sometimes at an even lower temperature less than or equal to about 550° C. The use of this relatively low temperature prevents degradation of wavelength conversion material P such as a phosphor, which can improve the reliability of wavelength conversion structure 19. Accordingly, it allows a red phosphor (e.g., a nitride-based phosphor), whose thermal stability is relatively low, to be used as wavelength conversion material P. This improvement addresses a problem in which a silicon composition in glass composition G and/or a nitride-based red phosphor among wavelength conversion material P, may deteriorate at higher temperatures compared to a green phosphor (e.g., a garnet-based phosphor) or a yellow phosphor (e.g., a garnet-based phosphor). In certain embodiments, the red nitride phosphor may be at least one of $MAlSiN_x:Eu(1 \leq x \leq 5)$ and $M_2Si_5N_8:Eu$. Here, M is at least one of barium (Ba), strontium (Sr), calcium (Ca), and magnesium (Mg).

Figure 3:
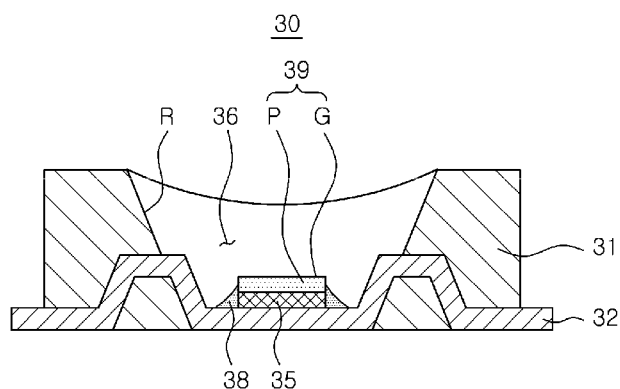
FIG. 3 is a cross-sectional view of an apparatus comprising a semiconductor LED and a wavelength conversion structure, according to an embodiment of the inventive concept.

FIG. 3 is a cross-sectional view of an apparatus comprising a semiconductor LED and a wavelength conversion structure, according to an embodiment of the inventive concept.

Referring to FIG. 3, an apparatus 30 comprises a package body 31, a semiconductor LED 35, and a wavelength conversion structure 39. Similar to package body 11 of FIG. 1, package body 31 comprises a recess portion R and a lead frame 32 (or frames) coupled to package body 31 and partially exposed within recess portion R. Semiconductor LED 35 is disposed on lead frame 32, and a transparent resin portion 36 is provided in recess portion R to encompass semiconductor LED 35.

Wavelength conversion structure 39 is disposed directly on a surface of semiconductor LED 35 so as to be positioned on a path along which light is emitted from semiconductor LED 35. Wavelength conversion structure 39 may be fabricated as a single sheet and subsequently attached to a surface of semiconductor LED 35, or it may be fabricated as a single sheet and then cut to have a shape appropriate for the surface of semiconductor LED 35. Wavelength conversion structure 39 may also be attached to semiconductor LED 35 on a wafer level, rather than in units of individual LED chips.

The composition of wavelength conversion structure 39 may be similar to that of wavelength conversion structure 19, and it can be manufactured by processes similar to those described with reference to wavelength conversion structure 19.

Wavelength conversion structure 39 may have a relatively high refractive index, which can significantly enhance efficiency of extracting light from semiconductor LED 35. In general, a semiconductor LED generally has a relatively high refractive index, and light extraction efficiency may be lowered due to a difference between respective refractive indices of the semiconductor LED and an external environment. By implementing wavelength conversion structure 39 with a refractive index between those of semiconductor LED 35 and the external environment, light extraction efficiency can be enhanced. For example, where a refractive index of a GaN semiconductor LED is approximately 2.1, wavelength conversion structure 39 may have a refractive index greater than that of transparent resin portion 36 such as a silicon resin, thus enhancing light extraction efficiency. In this manner, to improve light extraction efficiency, wavelength conversion structure 39 may have a refractive index, typically greater than or equal to 1.5 or 1.52. This refractive index may be achieved by using glass composition G described above.

A resin portion 38 comprising light-reflective powder is disposed on lateral surfaces of semiconductor LED 35 to prevent unconverted light from being emitted through the lateral surfaces. Resin portion 38 also guides light to be emitted through the upper side of semiconductor LED 35, enhancing a conversion effect generated by wavelength conversion structure 39. The light-reflective powder may comprise, for instance, ceramic powder such as $TiO_2$ or $Al_2O_3$.

Figure 4:
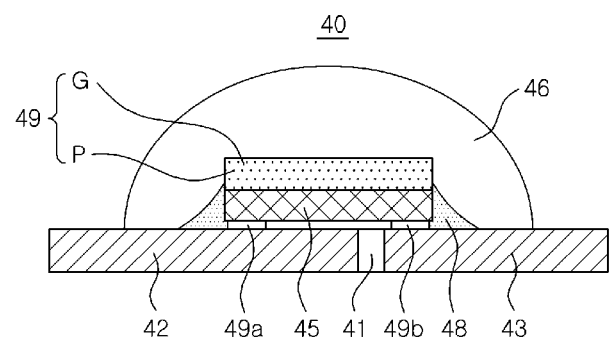
FIG. 4 is a cross-sectional view of an apparatus comprising a semiconductor LED and a wavelength conversion structure, according to an embodiment of the inventive concept.

FIG. 4 is a cross-sectional view of an apparatus comprising a semiconductor LED and a wavelength conversion structure, according to an embodiment of the inventive concept.

Referring to FIG. 4, an apparatus 40 comprises a package body 41, a semiconductor LED 45, and a wavelength conversion structure 49. Apparatus 40 further comprises first and second electrodes 49a and 49b formed on a common surface.

Package body 41 comprises first and second electrode structures 42 and 43, which are resin binding structures. Semiconductor LED 45 is mounted on first and second electrode structures 42 and 43, and in this state, first and second electrodes 49a and 49b are connected to first and second electrode structures 42 and 43, respectively. Wavelength conversion structure 49 is positioned on the surface of semiconductor LED 45, and it can be formed with a composition similar to wavelength conversion structure 39. Wavelength conversion structure 49 is typically formed as a sheet and cut to have a design appropriate for attachment to a surface of semiconductor LED 45.

In the illustrated embodiment, wavelength conversion structure 49 is only applied to an upper surface of semiconductor LED 45, so a reflective resin portion 48 containing light-reflective powder is disposed on lateral surfaces of semiconductor LED 45 to prevent unconverted light from being emitted through the lateral surfaces of semiconductor LED 45. Alternatively, reflective resin portion 48 may be replaced by a resin portion containing a wavelength conversion material to allow lateral transmission of light from semiconductor LED 45.

Apparatus 40 further comprises a transparent resin portion 46 encompassing semiconductor LED 45. Transparent resin portion 46 may be made of silicon, epoxy, or a combination thereof, and it typically has a refractive index less than or equal to about 1.5. Where wavelength conversion structure 49 has a high refractive index greater than or equal to about 1.5, light extraction efficiency may be improved.

In certain embodiments, wavelength conversion structure 49 may be formed by placing a wavelength conversion material on semiconductor LED chip 45 and then applying pressure to the wavelength conversion material to adjust its shape and/or thickness. By applying this pressure to the wavelength conversion material, wavelength conversion structure 49 may be formed with a thin plate-like shape on top of semiconductor LED chip 45.

Figure 5:
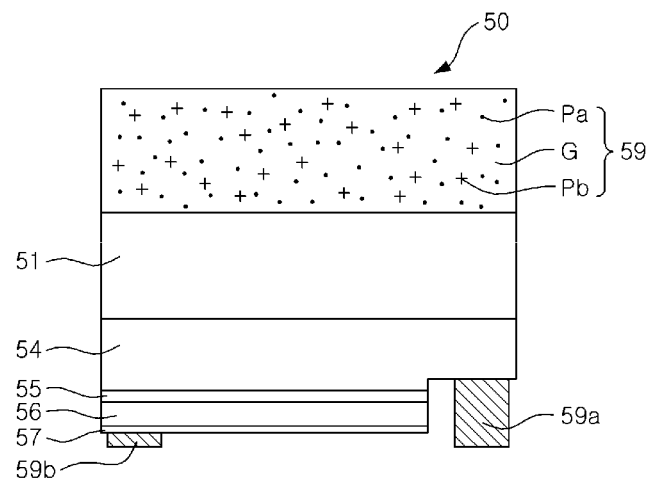
FIG. 5 is a cross-sectional view of an apparatus comprising a semiconductor LED and a wavelength conversion structure, according to an embodiment of the inventive concept.

FIG. 5 is a cross-sectional view of an apparatus comprising a semiconductor LED and a wavelength conversion structure, according to an embodiment of the inventive concept.

Referring to FIG. 5, an apparatus 50 has a flip-chip structure comprising a first conductivity-type semiconductor layer 54, an active layer 55, and a second conductivity-type semiconductor layer 56. These features are formed sequentially on a substrate 51. In the flip-chip structure, a highly reflective ohmic-electrode layer 57 is formed on second conductivity-type semiconductor layer 56. First and second electrodes 59a and 59b are formed on upper surfaces of the first conductivity-type semiconductor layer 54 and highly reflective ohmic-contact layer 57, respectively.

An upper surface of substrate 51 (i.e., a surface opposite a surface on which an epitaxial layer is grown) constitutes a primary light emitting surface, and a wavelength conversion structure 59 is formed on the upper surface of substrate 51. Wavelength conversion structure 59 may be cut so as to fit on the upper surface of substrate 51. If necessary, wavelength conversion structure 59 may be attached to the upper surface of substrate 51 in wafer form, i.e., before the wafer is cut into individual chips.

The composition of wavelength conversion structure 59 is similar to that of wavelength conversion structure 19 described above, except that it comprises at least two types of wavelength conversion materials Pa and Pb. Wavelength conversion materials Pa and Pb may be phosphors emitting light of different wavelengths. For example, where LED chip 50 is a blue LED chip having a wavelength ranging from 430 nm to 460 nm, wavelength conversion materials Pa and Pb may comprise a combination of different phosphors that collectively convert blue light into white light.

In some embodiments, wavelength conversion material Pa comprises a red phosphor and wavelength conversion material Pb comprises a yellow or green phosphor.

The red phosphor may be at least one of $MAlSiN_x$:Eu ($1 \leq x \leq 5$) and $M_2Si_5N_8$:Eu, and here, M may be at least one of barium (Ba), strontium (Sr), calcium (Ca), and magnesium (Mg). The green phosphor may be at least one of an oxide phosphor expressed by an empirical formula $M_3Al_5O_{12}$, an oxynitride phosphor expressed by an empirical formula $M_xA_yO_xN_{(4/3)y}$, an oxynitride phosphor expressed by an empirical formula $M_aA_bO_cN_{((2/3)a+(4/3)b-(2/3)c)}$, a β-sialon expressed by an empirical formula $Si_{6-z}Al_xO_xN_{8-z}$, and a $La_3Si_6N_{11}$:Ce phosphor. Here, M is at least one type of Group II or III element selected from the group consisting of yttrium (Y), lutetium (Lu), gadolinium (Gd), gallium (Ga), beryllium (Ge), magnesium (Mg), calcium (Ca), strontium (Sr), barium (Ba), zinc (Zn), europium (Eu), and cerium (Ce), and A is at least one type of Group IV element selected from the group consisting of carbon (C), silicon (Si), germanium (Ge), tin (Sn), titanium (Ti), zirconium (Zr), and hafnium (Hf). The yellow phosphor may be at least one of a silicate-based phosphor, a garnet-based phosphor, and a nitride-based phosphor.

Wavelength conversion structure 59 may be applied to a structure other than the flip-chip LED chip illustrated in FIG. 5. Apparatus 50 has a chip structure in which two electrodes are formed on the surface opposite to the primary light emitting surface thereof, but the wavelength conversion structure may also be applicable to a structure in which at least one electrode is formed in the primary light emitting surface as illustrated in FIG. 6.

Figure 6:
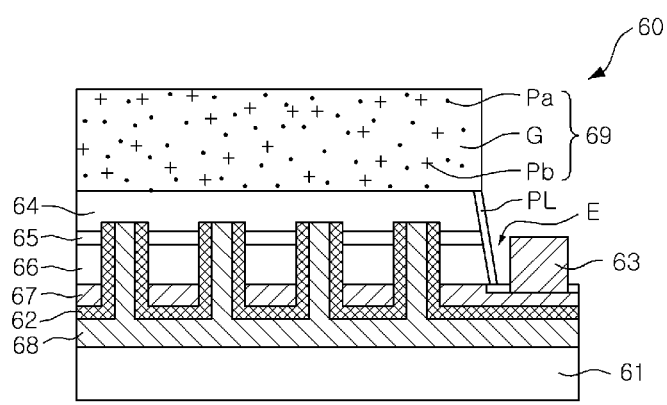
FIG. 6 is a cross-sectional view of an apparatus comprising a semiconductor LED and a wavelength conversion structure, according to an embodiment of the inventive concept.

FIG. 6 is a cross-sectional view of an apparatus comprising a semiconductor LED and a wavelength conversion structure, according to an embodiment of the inventive concept.

Referring to FIG. 6, an apparatus 60 comprises a conductive substrate 61, a first electrode layer 68, an insulating layer 62, a second electrode layer 67, a second conductivity-type semiconductor layer 66, an active layer 65, a first conductivity-type semiconductor layer 64, and a wavelength conversion structure 69 having a composition similar to that of wavelength conversion structure 59 described above.

First electrode layer 68 is laminated on conductive substrate 61. A partial region of first electrode 68 extends to first conductivity-type semiconductor layer 64 through contact holes penetrating through insulating layer 62, second electrode layer 67, second conductivity-type semiconductor layer 66, and active layer 65. Accordingly, conductive substrate 61 is electrically connected to first conductivity-type semiconductor layer 64.

Insulating layer 62 is formed on first electrode layer 68 to electrically insulate first electrode layer 68 from layers other than conductive substrate 61 and first conductivity-type semiconductor layer 64. Insulating layer 62 is located between the lateral surfaces of second electrode layer 67, second conductivity-type semiconductor layer 66, and active layer 65 exposed through the contact holes and first electrode layer 68, as well as between first electrode layer 68 and second electrode layer 67. Second electrode layer 67 is disposed on insulating layer 62. As illustrated, second electrode layer 67 has an exposed region E formed as a portion of an interface in contact with second conductivity-type semiconductor layer 66, and an electrode pad 63 for connecting an external power source to second electrode layer 67 may be provided in exposed region E. A passivation layer PL may be formed on a lateral surface of the epitaxial layer.

In the illustrated embodiment, an upper surface of first conductivity-type semiconductor layer 64 constitutes a primary light emitting surface, and electrode pad 63 is formed on a surface facing the same direction as the upper surface. Thus, wavelength conversion structure 69 is cut such that it covers the upper surface of first conductivity-type semiconductor layer 64 but does not cover exposed region E.

The concepts described with reference to FIG. 6 may be applied to different types of LED chips or LED chip structures. In these various alternatives, wavelength conversion structure 69 may be appropriately designed according to a position of an electrode pad for an external connection and a formation area of the electrode pad so as to be applied to a primary light emitting surface.

Figure 7:
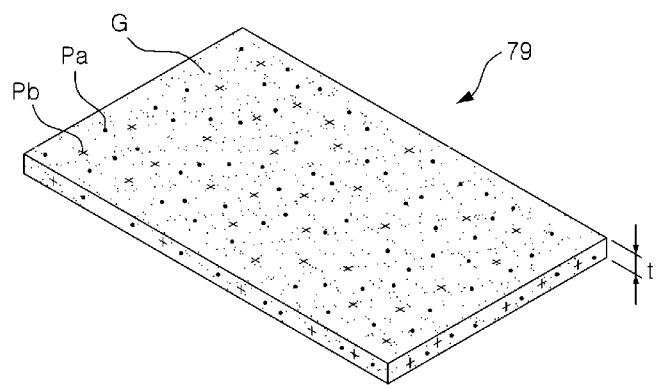
FIG. 7 is a perspective view of a wavelength conversion structure, according to an embodiment of the inventive concept.

FIG. 7 is a perspective view of a wavelength conversion structure, according to an embodiment of the inventive concept.

Referring to FIG. 7, a wavelength conversion structure 79 comprises a sintered body comprising at least two types of wavelength conversion materials Pa and Pb and glass composition G. It is formed with a composition similar to wavelength conversion structure 59 of FIG. 5. Wavelength conversion structure 79 is illustrated with a sheet-like shape of thickness "t", but it can be various modified according to design factors such as an excitation light source, light emitting direction, and the like.

Figure 8:
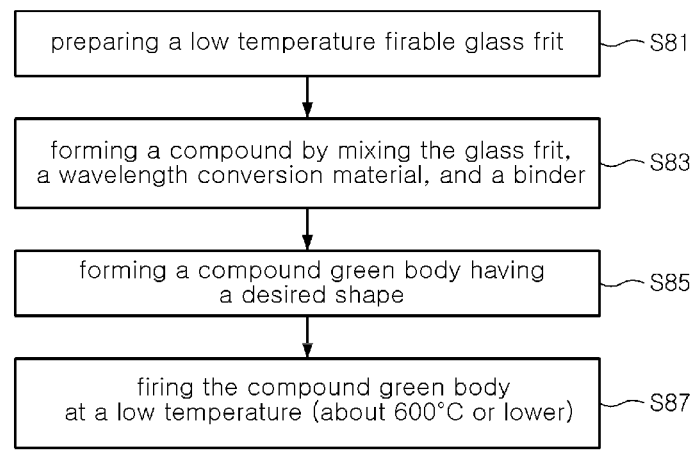
FIG. 8 is a flowchart illustrating a method of manufacturing a wavelength conversion structure, according to an embodiment of the inventive concept.

FIG. 8 is a flowchart illustrating a method of manufacturing a wavelength conversion structure, according to an embodiment of the inventive concept.

Referring to FIG. 8, the method comprises preparing glass frit that is able to be fired at a low temperature (S81), forming a compound by mixing the glass frit, a wavelength conversion material, and a binder (S83), forming a compound green body having a desired shape (S85), and firing the compound green body at a low temperature (S87).

Typically, the glass frit is prepared by supplying various raw materials to a crucible, heating the crucible at a relatively high temperature (e.g., 1300° C.) to melt the raw materials into liquid glass, cooling the liquid glass (e.g., in a water bath) to form solid glass, and then grinding the solid glass into powder. The raw materials comprise the components used to form glass composition G as described above. For example, they may comprise $ZnO$—$BaO$—$SiO_2$—$B_2O_3$ with at least one of $BaCO_3$, $Na_2CO_3$, $K_2CO_3$ and $Li_2CO_3$. A mixture of these components can be referred to as a precursor to glass composition G. The heating of the carbon-containing materials $BaCO_3$, $Na_2CO_3$, $K_2CO_3$ and $Li_2CO_3$ produces compounds $Na_2O$, $CaO$, $K_2O$ and $Li_2O$ as discussed above.

The glass frit may have a degree of light reflectivity, preferably, greater than or equal to 90%, or more preferably, greater than or equal to 95%, and after being sintered, it may become a sintered body having a high degree of transmittance (e.g., 90% or more). In a specific example, the glass frit may contain 30 wt % to 60 wt % of $ZnO$—$BaO$, 5 wt % to 25 wt % of $SiO_2$, 10 wt % to 30 wt % of $B_2O_3$, 5 wt % to 20 wt % of $P_2O_5$, and may additionally contain 20 wt % or less of $Na_2O$, $CaO$, $K_2O$, and $Li_2O$.

The glass frit is mixed with the wavelength conversion material and binder in a solvent. This mixture constitutes the compound of step S83. The wavelength conversion material typically comprises a phosphor, a mixture of phosphors, or quantum dots, as discussed above in connection with other embodiments. The phosphor or phosphors may comprise, for instance, a green phosphor, a yellow phosphor, an orange yellow phosphor, or a red phosphor. The binder serves to combine the glass composition and the wavelength conversion material, and it may be at least one organic binder selected from the group consisting of a cellulose resin, an acrylic resin, butylcarbitol, and terpineol, although the inventive concept is not limited thereto. The binder is typically removed from the composition prior to firing through a degassing operation.

The forming of the compound green body of desired shape typically comprises molding the compound into a sheet. A length of a wavelength conversion path is important as a factor determining a degree of conversion of a desired wavelength, and thus, a degree of conversion of a desired wavelength may be implemented by appropriately setting a thickness of the wavelength conversion structure. If necessary, the compound green body may be formed to have various shapes by using an appropriate mold structure. Examples of this process will be described with reference to FIGS. 9 through 12.

The compound green body is generally sintered at a low temperature to fabricate a wavelength conversion structure having the desired shape. The compound green body is derived from a low temperature-fired glass frit, so a sintering process may be performed at a temperature (e.g., approximately 600° C. or lower) that does not degrade the wavelength conversion material. Due to the composition of the glass frit, the sintering process may be performed at a temperature of approximately 550° C. or lower. Sintering at the low temperature allows for the use of a phosphor having a low degree of thermal stability. Thus, under the sintering temperature conditions, for example, a red phosphor, in particular, a red nitride phosphor, may be stably used and, as a result, white light emission can be effectively implemented.

FIGS. 9 through 12 are perspective views illustrating various steps in a method of manufacturing a wavelength conversion structure, according to an embodiment of the inventive concept. In the method of FIGS. 9-12, a compound green body is formed into a shape other than a sheet.

Figure 9:
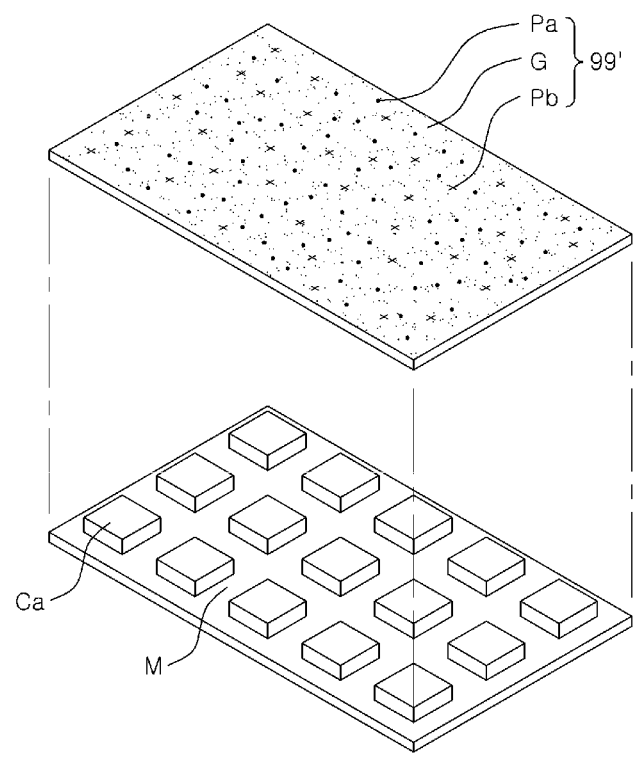
FIG. 9 is a perspective view illustrating a step in a method of manufacturing a wavelength conversion structure, according to an embodiment of the inventive concept.

Referring to FIG. 9, a compound sheet 99' is applied to a mold structure M. Compound sheet 99' is formed from a mixture of a glass frit, first and second wavelength conversion materials Pa and Pb, and a binder. Compound sheet 99' may be formed by steps S81 and S83 of FIG. 8, for instance. Mold structure M comprises blocks Ca having a quadrangular shape and arranged at regular intervals. Blocks Ca typically have a size corresponding to a chip.

Figure 10:
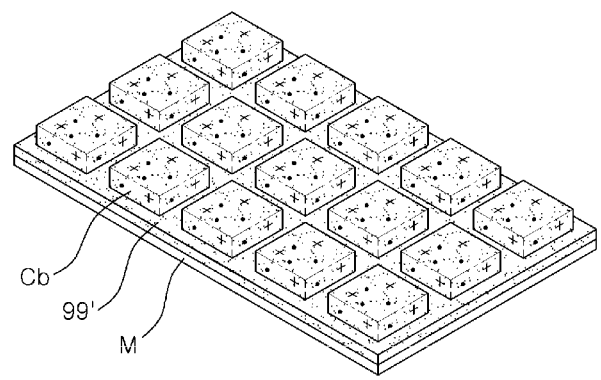
FIG. 10 is a perspective view illustrating another step in the method of FIG. 9, according to an embodiment of the inventive concept.

Referring to FIG. 10, predetermined amount of pressure or heat is applied to form a sheet structure having a shape corresponding to mold structure M. Following the application of pressure, compound sheet 99' may have convex cap structures Cb corresponding to quadrangular blocks Ca.

Figure 11:
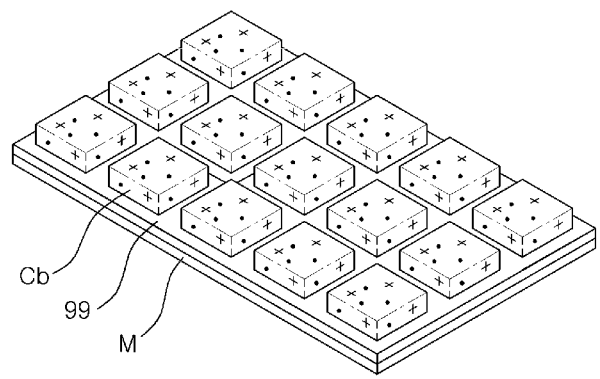
FIG. 11 is a perspective view illustrating another step in the method of FIG. 9, according to an embodiment of the inventive concept.

Referring to FIG. 11, a low temperature sintering process is performed to fabricate a wavelength conversion sheet 99 having convex cap structures Cb.

Figure 12:
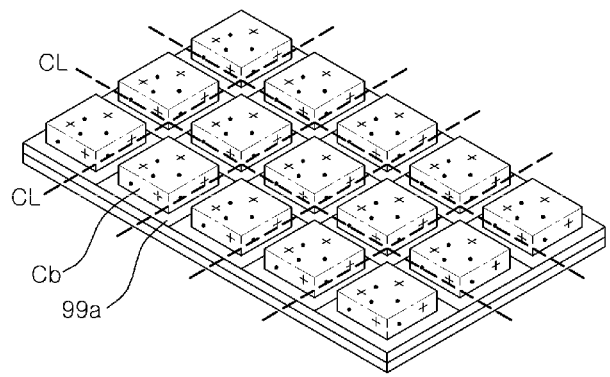
FIG. 12 is a perspective view illustrating another step in the method of FIG. 9, according to an embodiment of the inventive concept.

Referring to FIG. 12, wavelength conversion sheet 99 is cut based on cutting lines CL to produce individual wavelength conversion structures 99a. Wavelength conversion structures 99a each have a shape corresponding to cap structure Cb.

Figure 13A:
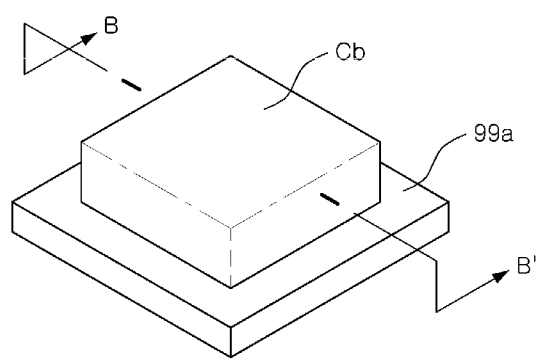
FIG. 13A is a perspective view of a wavelength conversion structure produced by the method of FIGS. 9-12, according to an embodiment of the inventive concept.
Figure 13B:
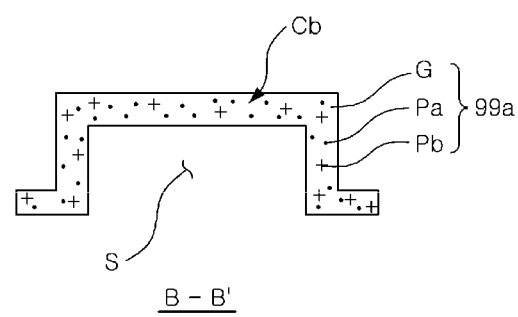
FIG. 13B is a cross-sectional view of a wavelength conversion structure produced by the method of FIGS. 9-12, according to an embodiment of the inventive concept.

FIGS. 13A and 13B are a perspective view and a cross-sectional view, respectively, of a wavelength conversion structure produced by the method of FIGS. 9-12, according to an embodiment of the inventive concept.

Referring to FIGS. 13A and 13B, cap structure Cb of wavelength conversion structure 99a has an accommodation portion S that opens in a downward direction. The size of accommodation portion S corresponds to a chip size, and it is designed to provide a space in which an LED chip may be positioned.

Figure 14:
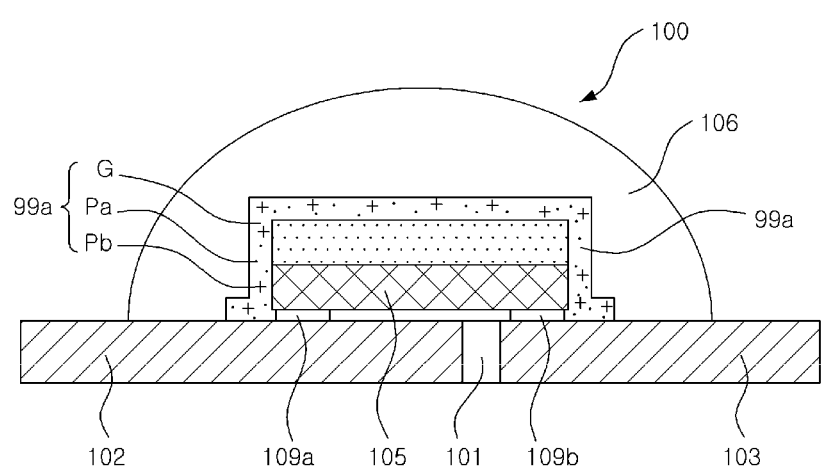
FIG. 14 is a cross-sectional view of an apparatus comprising a semiconductor LED and the wavelength conversion structure of FIGS. 13A and 13B, according to an embodiment of the inventive concept.

FIG. 14 is a cross-sectional view of an apparatus comprising a semiconductor LED and wavelength conversion structure 99a of FIGS. 13A and 13B, according to an embodiment of the inventive concept.

Referring to FIG. 14, an apparatus 100 comprises wavelength conversion structure 99a, a package body 101, and a semiconductor LED 105. Semiconductor LED 105 comprises first and second electrodes 109a and 109b formed on the same surface thereof. Package body 101 comprises first and second electrode structures 102 and 103, which are resin binding structures. Semiconductor LED 105 is mounted on first and second electrode structures 102 and 103, and first and second electrodes 109a and 109b are connected to the first and second electrode structures 102 and 103, respectively.

Wavelength conversion structure 99a is disposed over semiconductor LED 105, with semiconductor LED 105 positioned within accommodation space S. In this configuration, an entire light extraction surface of semiconductor LED 105 is encompassed by wavelength conversion structure 99a. The present embodiment may be advantageously used in a type of device in which a large quantity of light is extracted from lateral surfaces.

Apparatus 100 comprises a transparent resin portion 106 encompassing semiconductor LED 105. Transparent resin portion 106 is typically made of silicon, epoxy, or a combination thereof, and it typically has a refractive index less than or equal to about 1.5. Where wavelength conversion structure 99a has a refractive index greater than or equal to about 1.5, it may provide improved light extraction efficiency.

Figure 15:
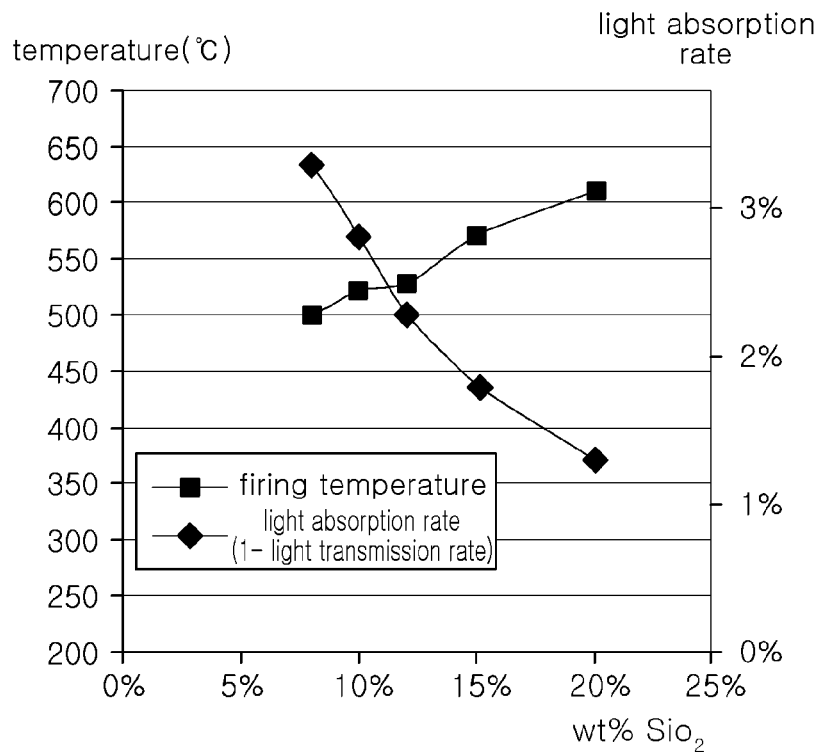
FIG. 15 is a graph illustrating a firing temperature and a light absorption rate of a glass composition as a function of % wt $SiO_2$ of the glass composition, according to an embodiment of the inventive concept.

FIG. 15 is a graph illustrating a firing temperature and a light absorption rate (i.e., "1-light transmittance rate") of a glass composition as a function of % wt $SiO_2$ of the glass composition, according to an embodiment of the inventive concept. In FIG. 15, firing temperature is shown on a y-axis on the left side, and light absorption rate is shown on a y-axis on the right side. The graph of FIG. 15 was produced with respect to a simulated glass composition comprising (20-x) wt % $Na_2CO_3$+$K_2CO_3$, 22 wt % $B_2O_3$, 25 wt % ZnO, 25 wt % $Zn_3PO_4$, 8 wt % $BaCO_3$, and (x)wt % $SiO_2$, where "x" represents the variable % wt $SiO_2$ as shown in FIG. 15 on the x-axis.

Referring to FIG. 15 and Table 1, specific values of firing temperature and light absorption are shown for $SiO_2$ concentrations of 8 wt %, 10 wt %, 12 wt %, 15 wt %, and 20 wt %.

TABLE 1

| | $SiO_2$ content | | | | |
|---|---|---|---|---|---|
| | 8 wt % | 10 wt % | 12 wt % | 15 wt % | 20 wt % |
| Light absorption rate | 3% | 2.5% | 2% | 1.5% | 1% |
| Firing temperature | 500° C. | 520° C. | 530° C. | 570° C. | 610° C. |

As indicated by FIG. 15 and Table 1, light absorption and firing temperature vary inversely with changing concentration of $SiO_2$. More specifically, as the concentration of $SiO_2$ increases, the light absorption rate tends to decrease while the firing temperature tends to increase.

At relatively high temperatures, such as 600° C. or higher, a red nitride phosphor reacts with $SiO_2$, resulting in lowered stability. Thus, it is beneficial to maintain firing temperature below approximately 600° C. This can be accomplished by forming the glass composition with a concentration of $SiO_2$ of about 15 wt % or less.

Figure 16:
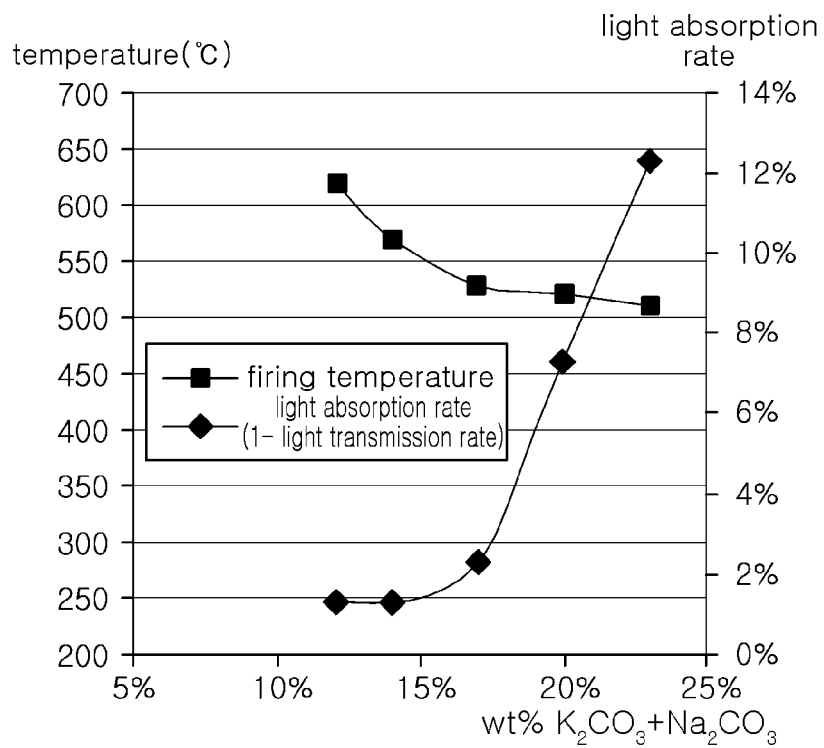
FIG. 16 is a graph illustrating a firing temperature and a light absorption rate of a glass composition as a function of % wt $K_2CO_3+Na_2CO_3$ of the glass composition, according to an embodiment of the inventive concept.

FIG. 16 is a graph illustrating a firing temperature and a light absorption rate of a glass composition as a function of % wt $K_2CO_3$+$Na_2CO_3$ of the glass composition, according to an embodiment of the inventive concept. The graph of FIG. 16 is similar to that of FIG. 15, except that the graph of FIG. 16 was produced with respect to a simulated glass composition comprising (x)wt % $Na_2CO_3$+$K_2CO_3$, 22 wt % $B_2O_3$, 25 wt % ZnO, 25 wt % $Zn_3PO_4$, 8 wt % $BaCO_3$, and 12 wt % $SiO_2$, where "x" represents the variable % wt $Na_2CO_3$+$K_2CO_3$ as shown in FIG. 16 on the x-axis.

Referring to FIG. 16 and Table 2, specific values of firing temperature and light absorption are shown for $K_2CO_3$+$Na_2CO_3$ at concentrations of 12 wt %, 14 wt %, 17 wt %, 20 wt %, and 23 wt %.

TABLE 2

| | $K_2CO_3$ + $Na_2CO_3$ content | | | | |
|---|---|---|---|---|---|
| | 12 wt % | 14 wt % | 17 wt % | 20 wt % | 23 wt % |
| Light absorption rate | 1% | 1% | 2% | 7% | 12% |
| Firing temperature | 620° C. | 570° C. | 530° C. | 520° C. | 510° C. |

Referring to FIG. 16, light absorption rate and firing temperature varies inversely with changing concentration of $K_2CO_3$+$Na_2CO_3$. In particular, as the concentration of $K_2CO_3$+$Na_2CO_3$ increases, firing temperature tends to decrease and light absorption rate tends to increase. To employ a phosphor having low thermal stability, such as a red nitride phosphor, a firing temperature of 600° C. or lower is desirable, so, a concentration of $K_2CO_3$+$Na_2CO_3$ may be beneficially 14 wt % or more, based on the data shown in FIG. 16. If, however, the concentration of $K_2CO_3$+$Na_2CO_3$ exceeds 20 wt %, light absorption rate increases dramatically to 7% or more (i.e., light transmittance is lowered) and a blackening phenomenon may occur due to crystallization of the glass composition. Thus, to avoid excessive light absorption rate, the concentration of $K_2CO_3$+$Na_2CO_3$ may be beneficially maintained at less than or equal to 20 wt %. Although FIG. 16 illustrates and example using a mixture of $K_2CO_3$ and $Na_2CO_3$, only one of $K_2CO_3$ and $Na_2CO_3$ could also be used to lower a firing temperature.

The following Table 3 illustrates concentrations of raw materials that may be used to produce a glass composition according to certain embodiments of the inventive concept, and the following Table 4 illustrates concentrations of wavelength conversion materials that may be included in a wavelength conversion structure with the glass composition.

In Table 4, color temperature measurements are provided for light output by apparatus 40 of FIG. 4, with a blue LED chip (Samsung Electronics CR35H) having a wavelength 450 nm (±2.5 nm) and coated with a silicon-based resin, and different wavelength conversion structures having the indicated concentrations of materials. The yellow, green, orange, short-wavelength red, and long-wavelength red phosphors of Table 4 have respective peak emission wavelengths of 545 nm, 530 nm, 595 nm, 610 nm, and 620 nm.

TABLE 3

| Component | Content (wt %) |
|---|---|
| ZnO | 24~27 |
| $Zn_3PO_4$ | 24~28 |
| $BaCO_3$ | 7~9 |
| $SiO_2$ | 9~15 |
| $B_2O_3$ | 21~24 |
| $Na_2CO_3$ | 6~7 |
| $K_2CO_3$ | 10~12 |

TABLE 4

| | Phosphor mixture ratio (wt %) | | | | | |
|---|---|---|---|---|---|---|
| Classification | Glass: phosphor (wt %) | Yellow | Green | Orange | Short wavelength red | Long wavelength red | Color temperature (K) |
| 1 | 45:55 | | 79 | | | 21 | 2700 |
| 2 | 50:50 | | 81.5 | | | 18.5 | 3000 |
| 3 | 53:48 | | 82.5 | | | 17.5 | 3500 |
| 4 | 55:45 | | 85.5 | | | 14.5 | 4000 |
| 5 | 58:42 | 75.2 | | 23.2 | 1.6 | | 5000 |
| 6 | 62:38 | 87 | | | 13.2 | | 5000 |
| 7 | 65:35 | 78 | | 22 | | | 5700 |
| 8 | 70:30 | 85 | | 16 | | | 6500 |

Based on the information in Table 4, a desired low color temperature can be stably implemented by maintaining a relatively high red phosphor content (classifications 1 to 3).

Figure 17:
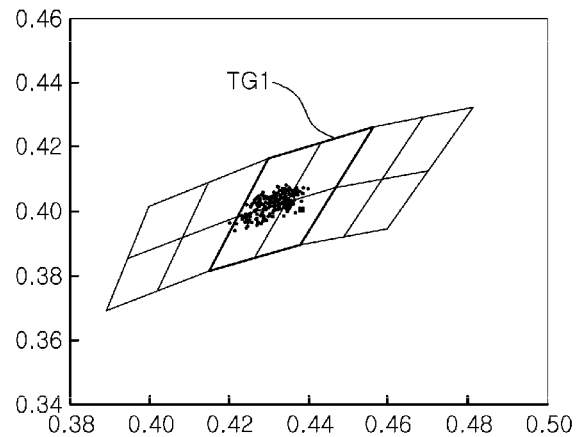
FIG. 17 is a CIE 1931 chromaticity diagram showing color distribution of an apparatus comprising a semiconductor LED and a wavelength conversion structure, according to an embodiment of the inventive concept.
Figure 18:
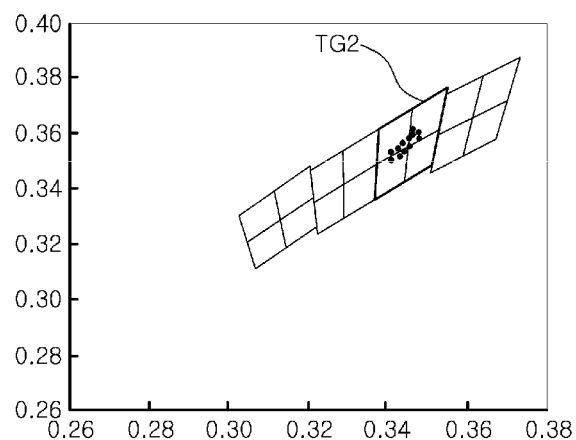
FIG. 18 is a CIE 1931 chromaticity diagram showing color distribution of an apparatus comprising a semiconductor LED and a wavelength conversion structure, according to an embodiment of the inventive concept.

FIGS. 17 and 18 are CIE 1931 chromaticity diagrams showing color distributions of an apparatus comprising a semiconductor LED and a wavelength conversion structure, according to an embodiment of the inventive concept. The diagram of FIG. 17 corresponds to classification 2 (3000K) of Table 4, and the diagram of FIG. 18 corresponds to classification 5 (5000K) of Table 4.

Referring to FIG. 17, where long-wavelength red phosphor is included with a concentration of 18.5 wt % to implement a low color temperature, a desirable distribution corresponding to a target color temperature region TG1 is obtained. The red phosphor may be a nitride phosphor. For example, it may be at least one of $MAlSiN_x$:Eu ($1 \le x \le 5$) and $M_2Si_5N_8$:Eu, where M may be at least one of barium (Ba), strontium (Sr), calcium (Ca), and magnesium (Mg). The red phosphor may be contained in an amount of approximately 5 wt % to 20 wt % of the wavelength conversion material.

Referring to FIG. 18, where a relatively small amount short-wavelength red phosphor is included in the wavelength conversion material, a resulting distribution corresponding to a target color temperature region TG2 is similar to that of FIG. 17. This indicates that the red phosphor, which has relatively low thermal stability, can be used to improve color temperature while avoiding degradation, comparable to other types of phosphors.

Figure 19:
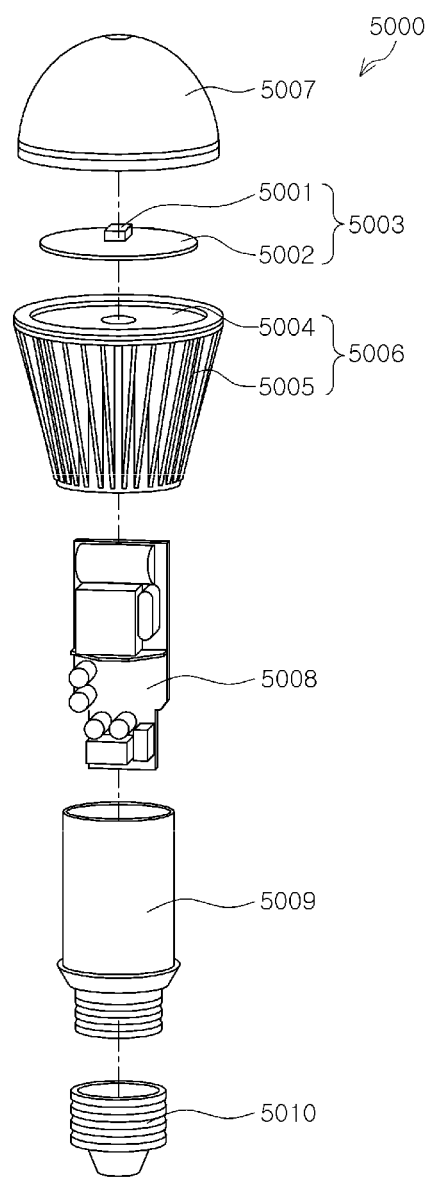
FIG. 19 is an exploded perspective view of a light bulb comprising an apparatus such as that illustrated in FIG. 14, according to an embodiment of the inventive concept.

FIG. 19 is an exploded perspective view of a light bulb comprising an apparatus such as that illustrated in FIG. 14, according to an embodiment of the inventive concept.

Referring to FIG. 19, a light bulb 5000 comprises a light emitting module 5003, a driving unit 5008, and an external connection unit 5010. Light bulb 5000 further comprises external and internal housings 5006 and 5009 and an external structure such as a cover unit 5007. Light emitting module 5003 comprises a semiconductor light emitting apparatus 5001 mounted on a circuit board 5002. Semiconductor light emitting apparatus 5001 may be implemented similar to one of the apparatuses described above, such as apparatus 10, 20, 30, 40, 50, 60 or 100.

Although FIG. 19 illustrates a single semiconductor light emitting apparatus 5001 mounted on circuit board 5002, the inventive concept is not limited thereto and a plurality of semiconductor LEDs may be mounted on circuit board 5002 as necessary. Also, in light bulb 5000, light emitting module 5003 comprises external housing 5006 serving as a heat dissipation unit, and external housing 5006 comprises a heat dissipation plate 5004 disposed in direct contact with light emitting module 5003 to enhance heat dissipation. Also, light bulb 5000 has cover unit 5007 installed on top of light emitting module 5003 and having a convex lens-like shape. Driving unit 5008 is installed in internal housing 5009 and is connected to external connection unit 5010 such as a socket structure to receive power from an external power source.

Driving unit 5008 serves to convert power into an appropriate current source for driving semiconductor light emitting apparatus 5001 of light emitting module 5003, and provide the same. For example, driving unit 5008 may be configured as an AC-DC converter, a rectifying circuit component, or the like.

Figure 20:
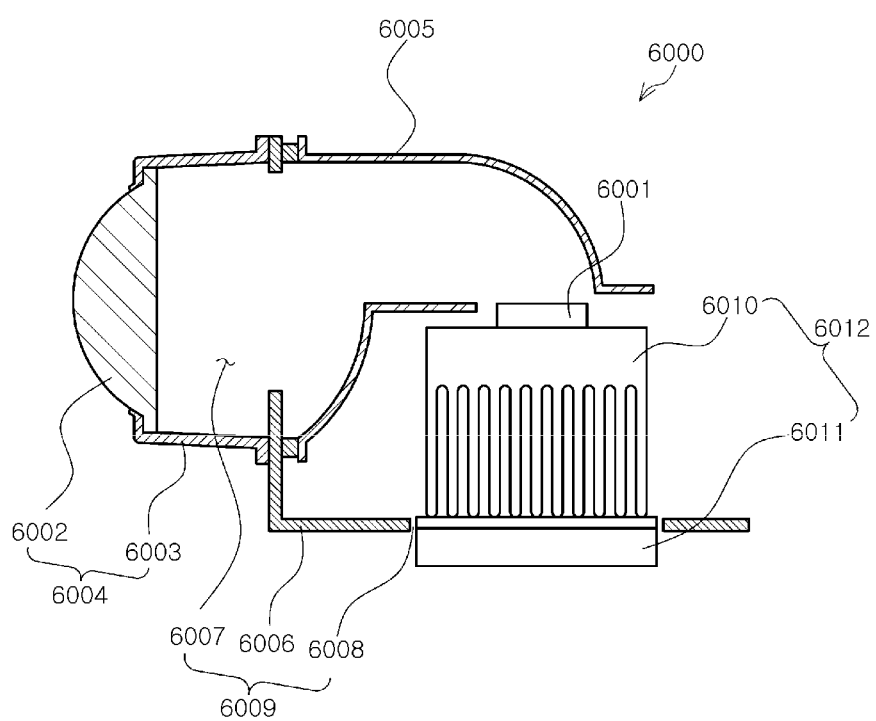
FIG. 20 is a cross-sectional view illustrating a head lamp comprising an apparatus such as that illustrated in FIG. 14, according to an embodiment of the inventive concept.

FIG. 20 is a cross-sectional view illustrating a head lamp comprising an apparatus such as that illustrated in FIG. 14, according to an embodiment of the inventive concept. This head lamp could be used, for instance, as a vehicle headlamp.

Referring to FIG. 20, a head lamp 6000 comprises a light source 6001, a reflective unit 6005, and a lens cover unit 6004. Lens cover unit 6004 comprises a hollow guide 6003 and a lens 6002. Also, head lamp 6000 may further include a heat dissipation unit 6012 dissipating heat generated by light source 6001 outwardly.

Light source 6001 may be a module in which at least one semiconductor LED as described above is employed. To effectively dissipate heat, heat dissipation unit 6012 may comprise a heat sink 6010 and a cooling fan 6011. Headlamp 6000 may further comprise a housing 6009 fixedly supporting heat dissipation unit 6012 and reflective unit 6005, and housing 6009 may have a central hole 6008 formed in one surface thereof, in which heat dissipation unit 6012 is coupled. Also, housing 6009 may have a front hole 6007 formed in the other surface integrally connected to the one surface and bent in a perpendicular direction. Front hole 6007 allows reflective unit 6005 to be fixedly positioned above light source 6001. Accordingly, a front side is opened by reflective unit 6005, and reflective unit 6005 is fixed to housing 6009 such that the opened front side corresponds to front hole 6007, and light reflected by reflective unit 6005 may pass through front hole 6007 so as to be output outwardly.

The foregoing is illustrative of embodiments and is not to be construed as limiting thereof. Although a few embodiments have been described, those skilled in the art will readily appreciate that many modifications are possible in the embodiments without departing from the scope of the inventive concept as defined in the claims.

What is claimed is:

1. A wavelength conversion structure, comprising:
a sintered body comprising a mixture of a wavelength conversion material and a glass composition,
wherein the wavelength conversion material comprises at least one phosphor and the glass composition comprises ZnO, BaO, $SiO_2$ and $B_2O_3$ as essential components,
wherein the glass composition comprises 30-60 wt % ZnO—BaO, 5-20 wt % $SiO_2$, 10-30 wt % $B_2O_3$, and at least one additive composition of $Na_2O$, CaO, $K_2O$, $Li_2O$, and $P_2O_5$.

2. The wavelength conversion structure of claim 1, wherein the sintered body has a refractive index greater than or equal to 1.5.

3. The wavelength conversion structure of claim 1, wherein the sintered body has a total transmittance of at least 90% with respect to visible light.

4. The wavelength conversion structure of claim 1, wherein the at least one additive composition comprises 5-20 wt % $P_2O_5$, and 14-20 wt % $Na_2O+K_2O$.

5. The wavelength conversion structure of claim 1, wherein the glass composition comprises 5-15 wt % $SiO_2$.

6. The wavelength conversion structure of claim 1, wherein the at least one phosphor comprises at least two phosphors selected from a group consisting a red phosphor, a green phosphor and a yellow phosphor.

7. The wavelength conversion structure of claim 1, wherein the at least one phosphor comprises a red phosphor and at least phosphor selected from a group consisting a green phosphor and a yellow phosphor, and wherein the red phosphor comprises at least one of $MAlSiNx$:Eu($1 \le x \le 5$) and $M_2Si_5N_8$:Eu, and wherein M represents at least one of Ba, Sr, Ca, and Mg.

8. The wavelength conversion structure of claim 1, wherein the glass composition constitutes approximately 45-70 wt % of the mixture.

9. The wavelength conversion structure of claim 1, wherein the sintered body forms a plate structure.

10. A light emitting apparatus, comprising:
first and second electrode structures;
a semiconductor LED connected to the first and second electrode structures and emitting a light having a wavelength ranging from 430 nm to 460 nm; and
a wavelength conversion structure according to claim 1 and positioned in a light emission path of the semiconductor LED.

11. The light emitting apparatus of claim 10, further comprising a transparent resin portion disposed over the semiconductor LED and the wavelength conversion structure along the light emission path of the semiconductor LED,
wherein the wavelength conversion structure has a refractive index greater than a refractive index of the resin and less than a refractive index of the semiconductor LED.

* * * * *